United States Patent

Kruger et al.

Patent Number: 5,670,823
Date of Patent: Sep. 23, 1997

[54] INTEGRATED CIRCUIT BARRIER STRUCTURE

[76] Inventors: James B. Kruger, 164 Kelly Ave., Half Moon Bay, Calif. 94019; S. Jeffrey Rosner, 1235 College Ave., Palo Alto, Calif. 94306; Iton Wang, 20398 Clay St., Cupertino, Calif. 95014

[21] Appl. No.: 671,105
[22] Filed: Jun. 28, 1996

Related U.S. Application Data

[63] Continuation of Ser. No. 371,061, Jan. 10, 1995, abandoned, which is a continuation of Ser. No. 190,399, Feb. 2, 1994, which is a division of Ser. No. 898,980, Jun. 15, 1992, Pat. No. 5,286,676.

[51] Int. Cl.$^6$ .............. H01L 23/48; H01L 23/59; H01L 29/40
[52] U.S. Cl. ............. 257/751; 257/753; 257/767; 257/763; 257/915
[58] Field of Search .................. 257/751, 767, 257/753, 757, 758, 763, 768, 915

[56] References Cited

U.S. PATENT DOCUMENTS

| 3,879,746 | 4/1975 | Fournier | 257/767 |
|---|---|---|---|
| 4,566,026 | 1/1986 | Lee et al. | 257/751 |
| 4,702,967 | 10/1987 | Black et al. | 257/763 |
| 4,887,146 | 12/1989 | Hinode | 287/753 |
| 4,927,505 | 5/1990 | Sharma et al. | 204/34.5 |
| 4,977,440 | 12/1990 | Stevens | 257/767 |
| 4,985,750 | 1/1991 | Hoshino | 257/767 |
| 5,173,449 | 12/1992 | Lorenzen et al. | 257/758 |

FOREIGN PATENT DOCUMENTS

| 2235372 | 9/1990 | Japan | 257/751 |
|---|---|---|---|
| 4018760 | 1/1992 | Japan | 257/767 |

OTHER PUBLICATIONS

High-Temperature Contact Structures for Silicon Semiconductor Devices Wittmer, Appl. Phys. Lett. 37(6), Sep. 15, 1980 pp. 540-542.

A Quarter-Micrometer Interconnection Technology Using a TiN/A1-Si-Cu/TiN/A1-Si-Cu/TiN/Ti Multilayer Structure, Kikkawa et al. IEEE vol. 40. No., 2, Feb. 1993, pp. 296-302.

Primary Examiner—Mahshid D. Saadat
Assistant Examiner—T. M. Arroyo

[57] ABSTRACT

A barrier metal integrated circuit structure, including relatively thin, highly nitrided layers of TiW (i.e., TiW:N) straddling a central conductor layer, and in turn each being straddled by adjacent layers of relatively thick substantially un-nitrided TiW material, and a method for its fabrication including deposition of layers of TiW and TiW:N, the latter in a $N_2$ dominated atmosphere and/or under backbias conditions effective for establishing at least a saturated level of nitrogen into the TiW:N, resulting in an effective barrier to migration of conductor materials from the conductor layer.

6 Claims, 1 Drawing Sheet

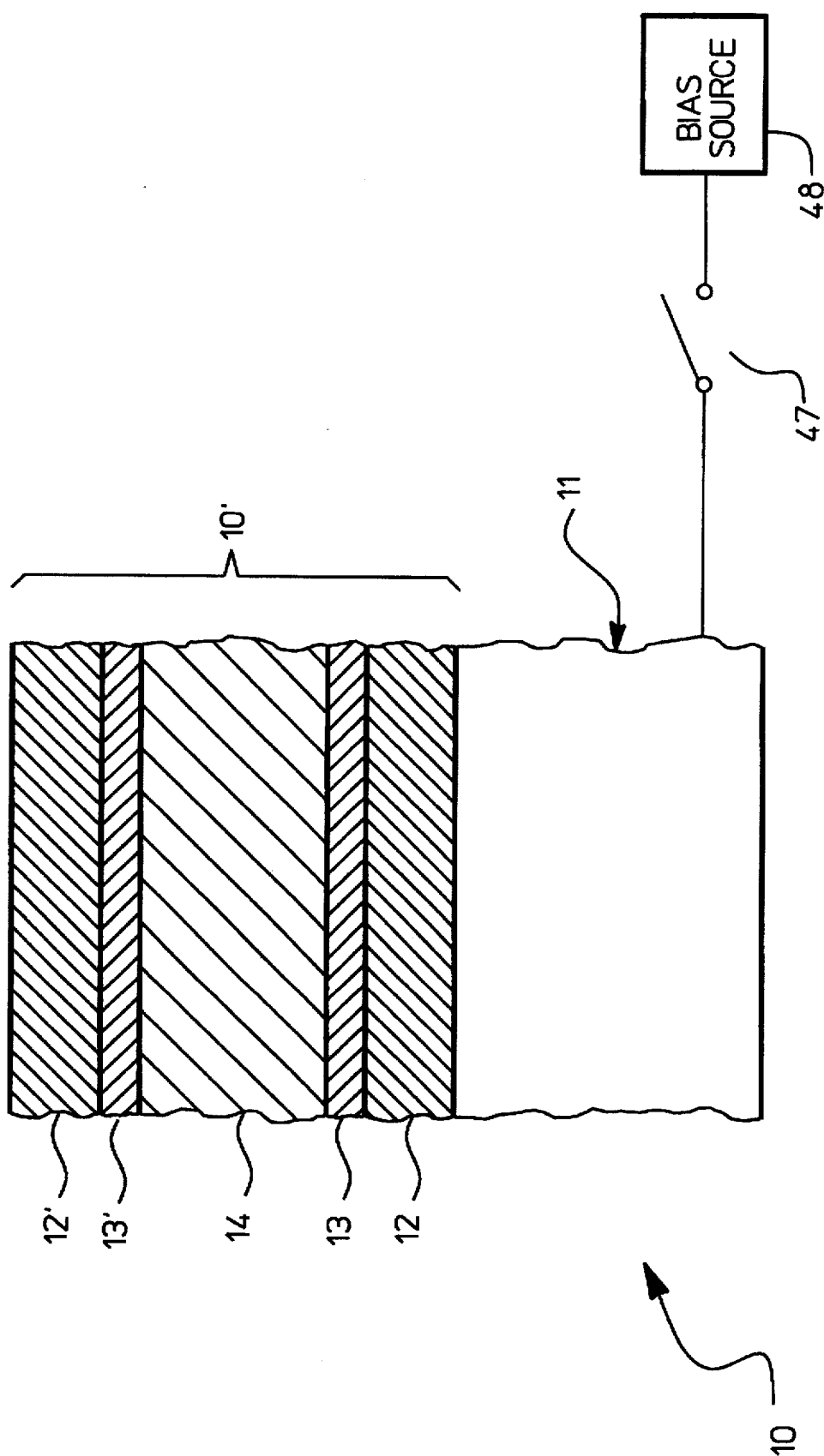

INTEGRATED CIRCUIT BARRIER STRUCTURE

CROSS-REFERENCE TO RELATED APPLICATION(S)

This is a continuation of application Ser. No. 08/371,061 filed on Jan. 10, 1995, now abandoned, which is a continuation of application Ser. No. 08/190,399, filed on Feb. 2, 1994, now abandoned. Application Ser. No. 08/190,399 is a Divisional of Ser. No. 07/898,980 filed Jun. 15, 1992, now U.S. Pat. No. 5,286,676.

BACKGROUND OF THE INVENTION

The present invention is directed toward the field of integrated circuit (IC) barrier structures and methods, and more particularly toward multi-layer TiW structures for preventing undesired diffusion of conductor materials within the IC structures.

Barrier layers are employed in conventional integrated circuits adjacent to composite or layered metal lines including conductor materials used for interconnecting devices within integrated circuits fabricated on silicon chips. The metal lines are fabricated from electrical conductor material, such as AlCu or AlSiCu for example, sandwiched between straddling "barrier layers" of refractory metal or metallic alloy material, for example TiW, an alloy of 10–30 atomic % Ti in W.

These barrier layers are conventionally provided for many reasons including the effective prevention of the interaction of the conductor materials such as aluminum for example with adjacent structures and materials for example adjacent silicon structures, according to a phenomenon called "spiking." The phenomenon of spiking may involve the penetration of the conductor metals such as Al into adjacent semiconductor structures, and this may result in short circuit defects damaging to device operation.

Additionally, according to conventional knowledge and practice, these barrier layers are of a nature effective to reduce top surface reflectivity for semiconductor devices, which is advantageous to permit effective operation of photolithographic techniques used in semiconductor manufacturing. In particular, the top surface of a barrier layer is of diminished reflectivity and can effectively reduce the comparatively high optically reflective surface of the electrical conductor material employed to make device interconnections within a particular integrated circuit device to an acceptable level. This diminished reflectivity improves the photolithographic patterning capability of the electrical conductor layer, as is conventionally recognized.

The barrier layers are additionally conventionally known to be effective for suppressing plastic flow of aluminum atoms during fabrication of integrated circuit devices, thereby becoming effective to prevent so-called "hillock" formations and to shunt current aside to minimize the risk of an open circuit developing from electromigration of conductor materials, or moreover even the stress-induced migration of conductor materials such as aluminum.

However, despite the above advantageous features and advantages of conventional barrier layers, their structures, and the methods for making them, there are problems encountered with the barrier layer structures and the methods for making them, according to the current and past state of the art of this technology. One such problem is that the barrier layers in past and current multi-layer IC structures require a disadvantageous thickness of the barrier metal layer itself to be effective in minimize "spiking". Traditional multi-layer IC structures rely upon particularly thick layers of TiW to reduce open circuit defects due to electromigration from the electrical conductor used for electrical interconnections within IC structures. Current TiW thicknesses may be acceptable with semiconductor processes having junction depths greater than 0.2 micrometers, wherein spiking is not a primary concern. With such processes, current thicknesses of the barrier layers provides no significantly prohibitive problem.

Unfortunately, spiking becomes a more significant problem with structures defined by semiconductor processes directed toward junction depths of less than 0.2 micrometers. In particular, submicron processes are subject to more severe constraints.

Additionally, the barrier layer which is electrically conductive can react with the primary electrical conductor, reducing electrical conductivity of the entire conductor structure. This can be controlled by passivating the interface between the barrier metal and the primary electrical conductor.

An additional problem encountered with barrier layer fabrication relates to the temperature processing steps which must be used in later fabrication steps to preserve the structures already fabricated. As is well known, selecting a semiconductor process defines the basic parameters of the structures and materials which can be used, including their dimensions and their intermediate processing. Traditionally, nitrided TiW (TiW:N) can be formed by using rapid thermal annealing (RTA) in $N_2$ or $NH_3$ ambient or reactive sputtering techniques. Further, the ideal temperature range for reaction of non-porous saturated TiW:N layers using RTA is 700°–900° C.

However, this approach is limited to a first application of a layer of TiW:N. Once a subsequent conductor layer, e.g. Al, is deposited, the temperature range for subsequent manufacturing methods is very restricted, and a processing range of 700°–900° C. is no longer tenable. Thus, for any further layers of TiW:N which are thereafter desirable, fabrication must then be typically conducted according to a process such as reactive sputtering, which can employ lower temperature processing.

Unfortunately, reactive sputtering at these lower temperatures results in a TiW:N layer of high diffusivity which is especially susceptible to spiking. Compared to structures fabricated according to RTA processing, a much thicker layer of TiW:N is required to provide a wider barrier margin against defects, when lower temperature processes are employed. The enhanced thickness of the barrier layer of TiW:N which must be employed to address the increased likelihood of defects of course results in additional processing which is coupled with no significant advantages, a step which for example does not make the final structures fabricated have any added current carrying capacity.

Thus, an object of this invention is the development of improved diffusion barrier structures employing TiW and TiW:N alloy layers, which are functionally effective, economical to employ, and are not subject to current disadvantages and limitations.

SUMMARY OF THE INVENTION

The invention herein is accordingly directed toward an integrated circuit structure including a conductor layer bounded or straddled by adjacent thin barrier metal layers which offer relatively low resistance to the passage of electric current therethrough and which additionally serve as a barrier to the migration of conductor materials from conductor layer materials into adjacent integrated circuit structures.

The invention is additionally directed toward methods for making the indicated integrated circuit structures. One method according to the invention addressed herein includes steps involving the deposition of successive adjacent layers of TiW and TiW:N, the latter in an atmosphere of activated $N_2$ (nitrogen in plasma flow) which by volume contains nitrogen and other gases, the nitrogen concentration therein being dominating with respect to the other gaseous constituents. By dominating, it is meant that a concentration by volume of 20–100% activated nitrogen is employed during fabrication of the nitrided TiW:N or a supplementary electric field in a volume of 100% activated nitrogen is applied to an underlayer of TiW or substrate of TiW or a layer or substrate in contact therewith is employed. The result is that the nitrogen concentration in the TiW:N exceeds the level it would otherwise have if the TiW layer were fabricated in a non-activated nitrogen environment or which it would have if no backbiasing of the TiW layer or a structure adjacent thereto were employed. Such fabrication in a nitrogen dominated atmosphere results in an effective barrier to diffusion of conductor materials from the conductor layer, and the nitrided TiW layers being directly adjacent to the conductor layer. This technique is not limited to TiW. It can be applied to any transitional metal which forms a nitrided compound, such as Al, Ti, Cr, Cu, Mo, Ta, W and any alloys of the aforementioned metals to enhance the effectiveness of the chosen metal as a barrier layer.

Further according to the invention herein, fabrication of the indicated integrated circuit structure includes the following layers and steps. A first layer of TiW, which is for example on the order of 1500 Å thick, is preferably deposited upon an oxide coated substrate with etched openings that reveal an underlayer such as silicon or polysilicon or other conductive layers. This first layer of TiW is followed by either a nitrogen back-sputtered (NBS) or a simultaneous deposition and etch of TiW:N layer preferably on the order of 30 Å thick being deposited upon the initial TiW layer, with such deposition necessarily being applied or deposited in the presence of a substantially pure $N_2$ plasma, i.e., one which is "nitrogen-dominated." The resulting combined barrier layer structure thus comprises a thin layer of TiW adjacent to an even thinner layer of TiW:N applied in substantially pure nitrogen gas. This results in a heavily nitrided TiW:N layer which is particularly effective as a barrier against adjacent conductor metal diffusion within the integrated circuit structures being fabricated.

The TiW:N layers thereby fabricated are excellent diffusion barriers to conductor materials which are typically employed in IC processing. The nitrided TiW layers so deposited according to the indicated process can withstand heat conditions at up to approximately 450° C. temperature cycles with little or no significant intermixing of conductor materials from the metal layers within the IC structures being fabricated. A selected conductor material such as AlCu can thus be deposited upon the TiW:N layer using conventional d-c magnetron sputtering techniques. Thereafter, a second NBS TiW:N layer on the order of about 30 Å thick can workably be deposited upon the selected conductor material, according to a preferred approach of the invention.

A more complete understanding and appreciation of the aims and objectives of the present invention may be achieved by referencing the following description of the preferred embodiment and the accompanying drawing.

A BRIEF DESCRIPTION OF THE DRAWING

The Drawing shows a cross-sectional view of an IC barrier structure according to the invention herein, including its combined layer structure of adjacent TiW and TiW:N layers.

A DETAILED DESCRIPTION OF THE PREFERRED EMBODIMENT

The Drawing herein shows a cross-sectional view of a portion of a multi-layer structure 10 including a barrier structure 10' according to the invention and a substrate 11 upon which the barrier structure 10' is suitably applied or deposited. Accordingly, multi-layer structure 10 includes barrier structure 10' and a substrate 11.

Barrier structure 10' further includes first, second, third, and fourth barrier layers made of metallic materials as will be discussed below, respectively 12, 12', 13, 13', and a primary conductor layer 14 which is sandwiched between respective third and fourth barrier layers 13 and 13' in order to prevent diffusion of conductor materials from primary conductor layer 14 therethrough. Primary conductor layer 14 may be fabricated from selected electrically conductive materials, such as for example but not limited to copper, aluminum, or alloys of copper and aluminum.

Barrier layers 13 and 13' are preferably fabricated of highly-nitrided TiW or any transitional metals which form nitride compounds to establish an effective barrier which inhibits undesired diffusion of conductive materials to a required level. Such highly-nitrided TiW (i.e., highly-nitrided TiW:N) can be fabricated according to a preferred way of carrying out the invention, by deposition of TiW layer material in a substantially pure $N_2$ plasma, i.e., a nitrogen-dominated atmosphere. As will be discussed in detail below, by use of these TiW:N material, the likelihood of spiking from conductor layer 14 through adjacent barrier layers 13 and 13' is diminished or controlled. This makes undesirable processing alternatives such as the use of Si doped Al (which can reduce electromigration resistance due to Si precipitation) unnecessary. Barrier layers 12 and 12' are preferably fabricated of TiW to provide low resistance electrical contacts to substrate 11 and external metal routing layers (not shown).

According to the invention, it is desired to produce particularly thin barrier layer structures. This may be achieved in a variety of ways through nitrogen backsputtering (NBS) techniques or by bias sputter deposition techniques, as will be discussed in detail below. By employing either approach, it is possible to produce layer thicknesses for layers 13 and 13' which are on the order of approximately 30 Å, effectively reducing total resistance in via IC structures made according to arrangements of the invention, by as much as 0.8 ohm/via for 1 µm size vias.

Nitrogen backsputtering within the meaning of the invention includes the steps of fabrication of barrier structure 10' by backsputtering layers of highly nitrided TiW:N, 13 and 13', immediately adjacent to the surface of conductor layer 14. Surface reactions with sputtering plasma and by direct shallow ion implantation of $N_2^+$ and $N^+$ ions is effective to form the desired highly-nitrided layers of TiW:N according to the invention. Nitrogen backsputtering is not limited to TiW. NBS can be applied to increase the nitrogen content of any transitional metal which forms nitride compounds including Al, Ti, Cr, Cu, Mo, Ta, W, and any alloys of the aforementioned metals being used as a barrier metal.

A desired effect of ion implantation in a pure or substantially pure gaseous $N_2$ atmosphere is that it is possible and, under the invention, desirable to leave resident more than the stoichiometric minimum amount of nitrogen in the fabrication of layers 13 and 13'. Although substantially pure $N_2$ is the preferred mode, an atmosphere where $N_2$ is the majority constituent, or at least a major constituent, of a preselected gaseous mixture is workable according to the invention. This results in substantially-saturated TiW:N according to the invention which tend to effect establishment of a desired low-defect, thin barrier metal layer effective to inhibit conductor material migration from conductor layer 14, because of the strong diffusion gradient established toward any nitrogen deficient region or defect in the metal. Generally, defect density is a problem in such a thin film (on the order of 100 Å or less in thickness), but this is effectively avoided by the invention disclosed herein.

According to this embodiment for carrying out the invention, sputtering or redeposition will tend to remove any undesired material, impurities, or defects in barrier layers 13 and 13'. Redeposition of the sputtered material is effective for sealing any cracks at the base of contact holes or trenches (not shown) which may be fabricated in the dielectric film being covered by the layered metal structure. These cracks undesirably allow interaction of the primary electrical conductor material, such as Al, with the underlying substrate, unfortunately resulting in possible junction spiking. The process of this invention addresses this problem and is effective in preventing or reducing spiking effects, for example extending through to the lower TiW internal surface of barrier layer 12 and the upper AlCu internal surface of barrier layer 12'.

To perform the inventive process, a conventional sputter deposition system (not shown) is loaded with IC wafers to be processed and is unconventionally pump loadlocked with a $N_2$ purge. The system is then vacuum pumped for example to less than approximately 5 E-7 Torr. The wafers are then subjected to temperature and power conditions of 320° C., 1.6 kW for about five (5) minutes. Using argon sputtering, the substrate surface of the wafer is cleaned (0.5 Kw, 6 mTorr, 2 minutes). Initially, a 1500 Å nominal thickness of TiW is deposited for example under conditions of argon at 18 mTorr and power at 2 Kw, employing three (3) passes at 50 cm/min. The TiW deposition which has thereby been accomplished is then followed by nitrogen backsputtering, involving for example $N_2$, 8 mTorr, 0.5 Kw, for a time period of approximately three (3) minutes. After the barrier metal layer 13 has been sputtered in place, a 5000 Å nominal thickness of AlCu may be deposited (under conditions of Ar at 12 mTorr, 9.5 Kw, 2 passes at 50 cm/min). Nitrogen backsputtering is then repeated to form a second barrier metal layer 13', accomplished by TiW deposition to establish a layer on the order of 500 Å thick, the deposition conditions involving for example Ar, 18 mTorr, 2 kW, 1 pass at 50 cm/min.

The resulting barrier layers of 13 and 13' of TiW:N are thus particularly thin according to the indicated ranges, and they are compatible with submicron semiconductor processes of current commercial interest. In particular, this approach permits convenient subsequent patterning of the underlying electrical conductor material and layers after photolithography processes have been accomplished. Barrier layers 12' and 13' can thereupon be sacrificially etched off during via oxide etch, thus providing a positive visual endpoint of via etch completeness.

Barrier structure 10', according to the invention, is particularly reworkable due to etch selectivity of the AlCu and TiW layers. Deposition and etching can advantageously occur within the same chamber system. The invention is applicable to batch machine systems as well as state-of-the-art single wafer, isolated chamber systems. In addition, the invention may be applied at any point in integrated circuit manufacturing, as the method operates at temperatures which will not degrade the electrical conductor employed. As is typical in semiconductor fabrication, temperature cycle tests were conducted at conditions on the order of 450° C. for 30 minutes. According to the results of one such testing operation, conventional structures display an 18% increase in sheet resistivity, while structures according to the invention display only a 2–3% increase in sheet resistance. This resistivity change is believed to be due to formation of $WAl_{12}$ or $TiAl_3$, as well as possibly due to titanium or tungsten diffusion into the Al or AlCu main conductor layer.

Structures according to the invention are subject to a desirable decrease in net post-processing sheet resistivity and thus can improve circuit speed by reducing the R-C time constant of barrier structure 10'. The improved sheet resistivity effectively lowers R-C time constants for MOS as well as bipolar devices fabricated on integrated circuit chips according to the invention.

According to one variation of the inventive process, i.e., bias sputter deposition, a barrier layer 12 is deposited using conventional d-c magnetron sputtering to establish a thick bottom layer of TiW on substrate 11 with substrate 11 or another adjacent structure being subject to backbiasing with the effect of increasing the concentration of nitrogen in the exposed TiW material. Then barrier layer 13 is fabricated over layer 12 to establish, according to a preferred embodiment, a thin layer of TiW:N, by simply depositing TiW:N onto a backbiased substrate 11 in an activated $N_2$ plasma. This is accomplished by electrically biasing substrate 11 at approximately –450 volts by applying the indicated electrical potential through a suitable switch 47 leading to an electrical bias source 48. Electrical bias source 48 is a RF source resulting in a DC self bias although a DC source may be used. This backbias is applied at substantially the same time as 500 watts is applied to a TiW target (not shown) in the isolated chamber wafer system chosen for fabrication (also not shown). Following evacuation of the mentioned chamber system, activated $N_2$ plasma is released into or produced in the isolated chamber wafer system. The nitrogen content of the plasma may vary from 20%–100%, according to the invention. The backbiasing of the substrate 11 is essential according to the invention to achieve the desired high density TiW:N diffusion barriers 13 and 13'.

The thickness of the diffusion barrier established by layers 12, 13 and 12', 13' determines the temperature cycle which the barrier structure 10' can withstand during fabrication. Primary conductor layer 14, e.g., a layer of AlCu, for example, is deposited over barrier layer 13 using conventional d-c magnetron sputtering. Barrier layer 13' is next fabricated to establish a preferably thin layer of TiW:N over conductor layer 14 using the aforementioned process for applying barrier layer 13. Then, barrier layer 12' is established, preferably as a relatively thick layer of TiW by depositing TiW material over barrier layer 13' using conventional d-c magnetron sputtering, according to the same technique, for example, as performed to establish barrier layer 13.

Thus, by way of a summary, in accordance with the invention, a method of making an IC barrier structure, that is useful in semiconductor processing, is shown to have been established, which begins with application of a layer of TiW upon substrate 11. This step is followed by the deposition of a first TiW:N layer upon the TiW surface using the novel nitrogen back sputtering process herein disclosed. An electrical conductor is applied over the TiW:N layer. Then, a second barrier layer of TiW:N is deposited over the conductive material using the aforementioned technique.

According to a preferred embodiment of the invention, the technique of establishing layers of nitrided TiW:N, i.e., barrier layers 13 and 13', may include simultaneous fabrication under conditions of unbackbiased and biased nitrogen backsputtering. Further, according to the invention, it is within the scope of the invention to alternate the aforementioned techniques: nitrogen backsputtering and bias sputter deposition, according to desired time intervals. While singularly each method provides the highly-nitrided TiW:N layers 13 and 13' which are desired, the combination of these approaches is within the scope of the invention as well. A saturated nitrogen layer of TiW:N is one which includes nitrogen impressed into it in an activated nitrogen environment or by backbiasing techniques.

Although the above description is directed toward a preferred embodiment of the current invention, individuals versed in semiconductor process development will appreciate the versatility of the present invention, which is much broader and is defined in the claims which follow.

What is claimed is:

1. An integrated circuit barrier structure comprising:
   a substrate;
   a first barrier layer disposed on the substrate, the first barrier layer comprising a transitional metal capable of forming a nitride compound;
   a second barrier layer disposed on the first barrier layer, the second barrier layer comprising the same transitional metal as the first barrier layer, the second barrier layer thinner than the first barrier layer; and
   nitrogen saturating the second barrier layer in a concentration exceeding that concentration which would be consumed in a nitride reaction with the transitional metal of the second barrier layer, the nitrogen defining a diffusion barrier that prevents diffusion through the barrier layers of a conductor material deposited on the second barrier layer.

2. The integrated circuit barrier structure of claim 1, further comprising an electric conductor layer disposed on the second barrier layer.

3. The integrated circuit barrier structure according to claim 2, further comprising:
   a third barrier layer disposed on the electric conductor layer, the third barrier layer comprising a transitional metal capable of forming a nitride compound, the third barrier layer thinner than the first barrier layer;
   a fourth barrier layer disposed on the third barrier layer, the fourth barrier layer comprising the same transitional metal as the third barrier layer, the fourth barrier layer thicker than the third barrier layer; and
   nitrogen saturating the third barrier layer in a concentration exceeding that concentration which would be consumed in a nitride reaction with the transitional metal of the third barrier layer, the nitrogen defining a diffusion barrier that prevents diffusion of material from the electric conductor layer through the third and fourth barrier layers.

4. The integrated circuit barrier structure according to claim 3 wherein said third barrier layer has a thickness of between about 30 and 100 Å.

5. The integrated circuit barrier structure according to claim 1 wherein the second barrier layer has a thickness of between about 30 and 100 Å.

6. The integrated circuit barrier structure according to claim 1 wherein the transitional metal comprises an alloy of titanium and tungsten.

* * * * *